(12) United States Patent
Gerner et al.

(10) Patent No.: US 8,857,021 B2
(45) Date of Patent: Oct. 14, 2014

(54) LASER WELDED BONDING PADS FOR PIEZOELECTRIC PRINT HEADS

(75) Inventors: Bradley James Gerner, Penfield, NY (US); Peter J. Nystrom, Webster, NY (US); Bryan R. Dolan, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 18 days.

(21) Appl. No.: 13/524,791

(22) Filed: Jun. 15, 2012

(65) Prior Publication Data

US 2013/0335484 A1 Dec. 19, 2013

(51) Int. Cl.
*B41J 2/16* (2006.01)
*H05K 3/10* (2006.01)
*B41J 2/14* (2006.01)
*B23K 26/22* (2006.01)

(52) U.S. Cl.
CPC ............. *B23K 26/22* (2013.01); *B41J 2/14274* (2013.01)
USPC ............. 29/25.35; 29/890.1; 29/831; 29/840; 29/843; 29/860; 347/68; 347/70; 347/71; 219/121.64; 219/121.66

(58) Field of Classification Search
CPC ...... B41J 2/1607; B41J 2/1621; B41J 2/1623; B41J 2/14274; B41J 2/045; H05K 3/103; B23K 26/22
USPC ............... 29/25.35, 831, 840, 843, 846, 860, 29/890.1; 347/50, 68, 70, 71; 219/121.63, 219/121.64, 121.65, 121.66
See application file for complete search history.

(56) References Cited

U.S. PATENT DOCUMENTS

| 6,783,213 | B2 * | 8/2004 | Le et al. ........................ 347/71 |
| 7,000,314 | B2 * | 2/2006 | Morris ....................... 29/843 X |
| 2011/0298871 | A1 | 12/2011 | Stephens et al. |

FOREIGN PATENT DOCUMENTS

| JP | 05104711 A | * | 4/1993 | ................. 29/890.1 |
| JP | 2009119634 A | * | 6/2009 | |

OTHER PUBLICATIONS

Peter J. Nystrom et al., U.S. Appl. No. 13/097,182, filed Apr. 29, 2011, titled "High Density Electrical Interconnect for Printing Devices Using Flex Circuits and Dielectric Underfill."
Peter J. Nystrom et al., U.S. Appl. No. 13/401,061, filed Feb. 21, 2012, titled "Laser Transmission Laminating of Materials for Ink Jet Printheads."

* cited by examiner

*Primary Examiner* — A. Dexter Tugbang
(74) *Attorney, Agent, or Firm* — MH2 Tehnology Law Group LLP

(57) ABSTRACT

An ink jet print head can be formed using a laser to melt a plating layer interposed between a piezoelectric actuator and a circuit layer bump. The plating layer can be formed on the circuit layer bump, the piezoelectric actuator, or both, and a laser beam output by the laser is used to melt the plating layer to provide a laser weld. In another embodiment, the circuit layer bump or the trace itself functions as the plating layer, which is melted using a laser to provide the laser weld.

9 Claims, 3 Drawing Sheets

LASER WELDED BONDING PADS FOR PIEZOELECTRIC PRINT HEADS

FIELD OF THE INVENTION

The present teachings relate to the field of ink jet printing devices and, more particularly, to a piezoelectric ink jet print head and methods of making a piezoelectric ink jet print head and a printer including a piezoelectric ink jet print head.

BACKGROUND OF THE INVENTION

Drop on demand ink jet technology is widely used in the printing industry. Printers using drop on demand ink jet technology can use either thermal ink jet technology or piezoelectric technology. Even though they are more expensive to manufacture than thermal ink jets, piezoelectric ink jets are generally favored as they can use a wider variety of inks and eliminate problems with kogation.

Piezoelectric ink jet print heads typically include a flexible diaphragm and an array of piezoelectric actuators (i.e., piezoelectric transducers, piezoelectric elements) attached to the diaphragm. When a voltage is applied to a piezoelectric element, typically through electrical connection with an electrode electrically coupled to a power source, the piezoelectric element bends or deflects, causing the diaphragm to flex which expels a quantity of ink from a chamber through a nozzle. The flexing further draws ink into the chamber from a main ink reservoir through an opening to replace the expelled ink.

Increasing the printing resolution of an ink jet printer employing piezoelectric ink jet technology is a goal of design engineers. Increasing the jet density of the piezoelectric ink jet print head can increase printing resolution. One way to increase the jet density is to eliminate manifolds which are internal to a jet stack. With this design, it is preferable to have a single port through the back of the jet stack for each jet. The port functions as a pathway for the transfer of ink from the reservoir to each jet chamber. Because of the large number of jets in a high density print head, the large number of ports, one for each jet, must pass vertically through the diaphragm and between the piezoelectric elements.

Processes for forming a jet stack can include the formation of a patterned standoff layer having openings therein which expose a top surface of each piezoelectric element. A quantity (i.e., a microdrop) of conductor such as conductive epoxy, conductive paste, or another conductive material is dispensed individually on the top of each piezoelectric element. Electrodes of a flexible printed circuit (i.e., a flex circuit) or a printed circuit board (PCB) are placed in contact with each microdrop to facilitate electrical communication between each piezoelectric element and the electrodes of the flex circuit or PCB. The standoff layer functions to contain the flow of the conductive microdrops to the desired locations on top of the piezoelectric elements, and also functions as an adhesive between the interstitial layer and the flex circuit or PCB.

Methods for manufacturing a print head having electrical contacts which are easier to manufacture and have a higher reliability over the lifetime of the device than prior structures, and the resulting print head and printer, would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

In an embodiment of the present teachings, a method for forming an ink jet print head can include physically contacting a conductive circuit layer of a circuit with a piezoelectric actuator of a print head subassembly, heating the conductive circuit layer and the piezoelectric actuator with a laser beam to melt the conductive circuit layer, and cooling the melted conductive circuit layer to solidify the melted conductive circuit layer, wherein the solidified conductive circuit layer provides a laser weld which physically connects the conductive circuit layer to the print head subassembly and electrically couples the conductive circuit layer to the print head subassembly.

In another embodiment of the present teachings, an ink jet print head can include a piezoelectric actuator and a conductive circuit layer physically attached to the piezoelectric actuator, wherein the conductive circuit layer provides a laser weld which electrically couples the conductive circuit layer to the print head subassembly.

In another embodiment of the present teachings, a printer can include a printer housing and at least one print head enclosed in the printer housing. The print head can include a piezoelectric actuator and a conductive circuit layer physically attached to the piezoelectric actuator, wherein the conductive circuit layer provides a laser weld which electrically couples the conductive circuit layer to the print head subassembly.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

It should be noted that some details of the FIGS. have been simplified and are drawn to facilitate understanding of the present teachings rather than to maintain strict structural accuracy, detail, and scale.

DESCRIPTION OF THE EMBODIMENTS

Reference will now be made in detail to illustrative embodiments of the present teachings, examples of which are illustrated in the accompanying drawings. Wherever possible, the same reference numbers will be used throughout the drawings to refer to the same or like parts.

As used herein, the word "printer" encompasses any apparatus that performs a print outputting function for any purpose, such as a digital copier, bookmaking machine, facsimile machine, a multi-function machine, etc.

With conventional processes for forming jet stacks such as those discussed above, the amount of liquid conductor must be carefully controlled, because too little conductor can result in electrical opens and a nonfunctional actuator, while excessive conductor can result in overfill and electrical shorts between adjacent actuators. Further, the conductor can be forced under the standoff layer during attachment of a circuit, for example a printed circuit board or flexible printed circuit, which can result in electrical shorts and malfunctioning devices.

Embodiments of the present teachings can simplify the manufacture of a jet stack for a print head, which can be used as part of a printer. Further, the present teachings can result in simplified connection to a actuator array, particularly as actuator arrays continue to become more dense in order to increase print resolution. The present teachings can include the use of a circuit such as a flexible printed circuit (i.e., a "flex circuit") or printed circuit board having one or more electrically conductive circuit layers. In an embodiment, the conductive circuit layers can include a plurality of conductive elements (flex circuit electrodes, conductive bump electrodes) which electrically couple circuit traces within the flex circuit to the plurality of piezoelectric elements formed as part of a jet stack subassembly. In an embodiment, electrical communication between the conductive elements of the flex circuit and the piezoelectric elements can be established through another electrically conductive circuit layer, which is a metal or metal alloy plating on either on the conductive elements of the flex circuit or the piezoelectric elements, or both. The process for forming the jet stack as discussed herein can be more easily scaled with continued miniaturization of actuator arrays than some conventional processes.

Figure 1:
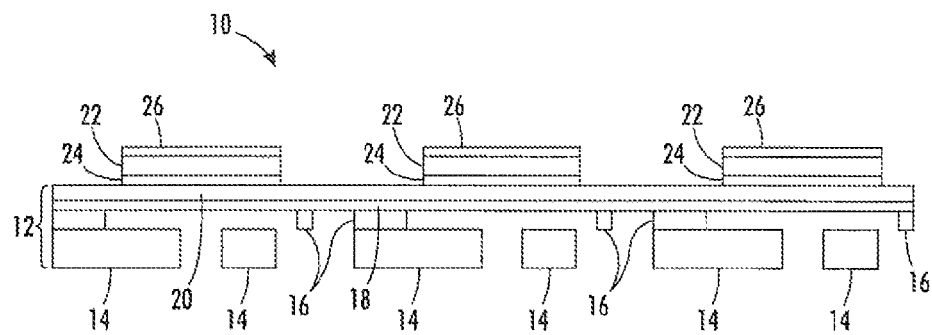
FIGS. 1-4 are cross sections depicting various in-process structures which can result during print head manufacture in accordance with an embodiment of the present teachings.

FIG. 1 is a cross section of a print head subassembly 10 in accordance with an embodiment of the present teachings. FIG. 1 depicts a portion of a print head jet stack 12 which, in this illustrative embodiment, includes an inlet/outlet plate 14, a body plate 16, a diaphragm attach adhesive 18, and a diaphragm 20 such as a stainless steel diaphragm. FIG. 1 further depicts a plurality of piezoelectric actuators 22 attached to the diaphragm 20 with an adhesive 24.

Each actuator 22 can include a metal or metal alloy plating 26 partially or completely covering an upper surface of each actuator 22. In an embodiment, plating 26 can be, for example, gold, copper, nickel or another metal or alloy between about 0.01 micrometers ($\mu$m) and about 10 $\mu$m thick. In another embodiment, the plating 26 can be a material which has a melting point of between about 600° C. and about 1600° C., or between about 600° C. and about 1200° C., or above about 600° C. A melting point of copper is about 1083° C., and a melting point of gold is about 1064° C. The plating 26 can be formed on the actuator 22 using, for example, electroplating techniques or chemical etching.

In yet another embodiment, the plating 26 can be a solder having a lower melting point than the gold, copper, nickel, etc. listed above, for example a melting point of between about 180° C. and about 190° C. Using a plating 26 with a lower melting point can reduce thermal impact on the structures around the plating layer and requires less power to process, but may result in a weld which has a larger spot size and may cause solder overflow.

In one embodiment for forming the plurality of actuators 22, a continuous blanket actuator layer is formed, and is then patterned to define the plurality of individual actuators 22. The plating 26 can be formed on the continuous actuator layer prior to etching, or after etching the continuous actuator layer.

While the print head subassembly 10 depicted in FIG. 1 includes three actuators 22, it will be understood that a print head can have hundreds or thousands of actuators 22. It will be apparent to one of ordinary skill in the art that the print head subassembly 10 depicted in FIG. 1 represents a generalized schematic illustration and that other components can be added or existing components can be removed or modified.

After forming the print head subassembly 10 of FIG. 1, an optional standoff layer 30 can be provided between the jet stack subassembly 12, and a circuit layer 32 such as a bumped flexible circuit layer (i.e., flex circuit) as depicted or another circuit layer can be aligned with the print head subassembly 10. If used, the standoff layer 30 can be provided in various configurations, such as over and directly between each actuator 22 as depicted in FIG. 2, between adjacent actuators 22 but not over each actuator 22, or over each actuator 22 but not directly between adjacent actuators 22.

The flex circuit 32 can include electrically conductive bumps 34 such as copper bumps electrically connected to electrically conductive traces 36, where the conductive traces 36 route a voltage to each actuator 22 such that each actuator 22 can be individually addressed. The bumps 34 and traces 36 can be encased within a first dielectric layer 38 and a second dielectric layer 40 such as polyimide, resin, polymer, etc. Additionally, the bumps 34 can further include a metal or metal alloy bump plating 42. The bump plating 42 can include a material and formation method similar to plating 26 discussed above. It will be understood that a structure and method in accordance with the present teachings can include both actuator plating 26 and bump plating 42 to provide two plating layers, or either but not both of the actuator plating 26 and the bump plating 42 to provide one plating layer.

Flex circuits and print heads are discussed, for example, in U.S. Pre-Grant Publication 2011/0298871 and U.S. patent Ser. No. 13/097,182, each of which is incorporated herein by reference in its entirety.

Figure 2:
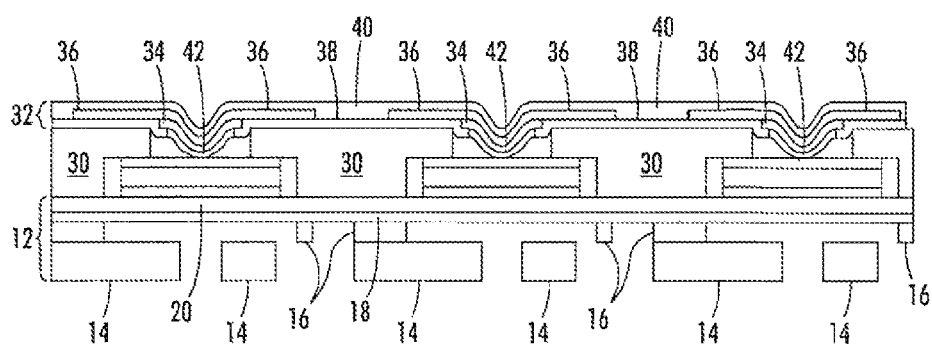

After providing the print head subassembly 10 and the circuit layer 32, circuit layer 32 can be aligned with the print head subassembly 10 as depicted in FIG. 2, with the bumps 34 being aligned with, and in physical contact with, the actuators 22. The circuit layer 32 can be held in contact with one of the actuators 22 using various techniques, for example a press, a jig, adhesive tacking, etc.

Figure 3:
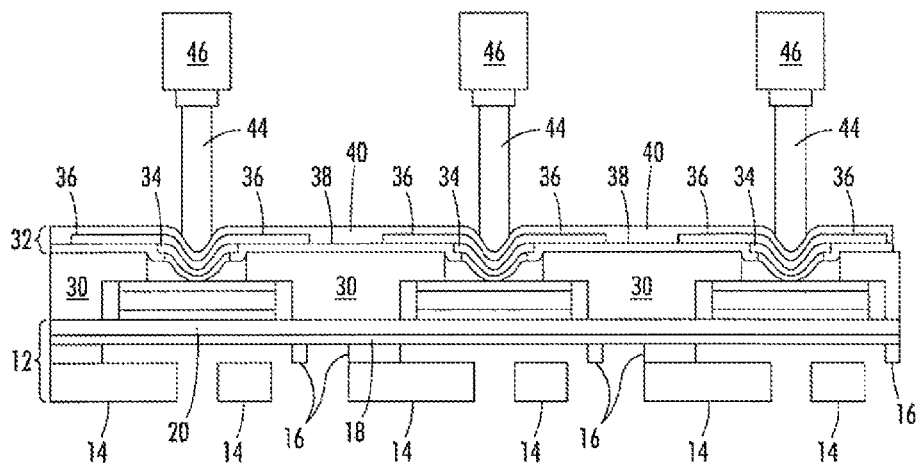

Next, the FIG. 2 structure is subjected to one or more pulses of a laser beam 44 output by a laser 46 as depicted in FIG. 3. The laser beam 44 can be targeted to be focused on the point of contact between the bump 34 and the actuator 22, and specifically the point of contact of any plating 26, 42. The focused laser beam heats the bump 34 and the actuator 22 to melt one or both plating layers 26, 42 interposed between the actuator 22 and the bump 34, depending on whether one or two plating layers is used. After removal of the laser beam, the one or both plating layers 26, 42 cools and solidifies to form a weld, for example a spot weld having a generally circular shape, which physically attaches the circuit layer 32 to the jet stack subassembly 12. The laser weld also electrically couples each trace 36 to one of the actuators 22 so that each actuator can be individually addressed during use.

Figure 4:
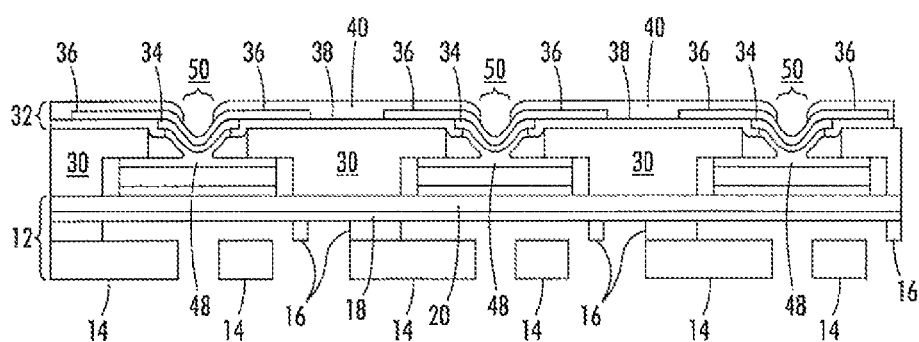

In an embodiment, the laser 46 can be one which outputs a beam 44 having a relatively long wavelength, for example, a $CO_2$ laser having a wavelength of about 10 $\mu$m. A spot weld size for a $CO_2$ laser is relatively large, for example between about 75 $\mu$m and about 150 $\mu$m, or about 100 $\mu$m creating an opening 50 as depicted in FIG. 4 through which the laser will heat the electrical trace 36 on the opposite side. In an embodiment, a $CO_2$ laser can have a power rating of between about 5 watts (W) and about 10000 W, or between about 5 W and about 250 W, or between about 5 W and about 100 W. Various laser welding techniques are discussed in U.S. patent Ser. No. 13/401,061, which is incorporated herein by reference in its entirety.

In another embodiment, the laser 46 can be one which outputs a beam 44 having a relatively short wavelength, for example, an ultraviolet (UV) yttrium-aluminum-garnet (YAG) green laser having a wavelength of about 532 nm. In an embodiment, a green laser can have a power rating of between about 15 W and about 50 W, or between about 20 W and about 35 W, or between about 25 W and about 35 W. This short wavelength YAG laser can form a relatively smaller weld size than the $CO_2$ laser, for example a laser weld having a diameter of between about 10 µm and about 30 µm, for example about 25 µm. The high energy shorter wavelength will also ablate a hole 50 through the second polyimide layer 40.

In selecting a laser wavelength and power rating, a laser outputting insufficient power would require an excessively long processing time and an excessive number of laser pulses to provide a reliable weld, and can result in an electrical open and a malfunctioning print head. A laser outputting excessive power can overheat the structure and result in delamination of the circuit layer 32, damage to the actuator 22, or detachment of the actuator 22 from the diaphragm 20.

In an embodiment, plating 42 on the traces 36 and/or the plating 26 actuators 22 can be omitted and the bumps 34 can be melted to establish electrical communication between the actuator 22 and the traces 36. In this embodiment, the bumps 34 themselves are the plating layer. In another embodiment, the plating 42 on the traces 36 and the plating 26 on the actuators 22 can be omitted and the traces 36 can be melted to establish electrical communication between the actuator 22 and the traces 36. In this embodiment, the traces 36 themselves are the plating layer.

FIG. 4 depicts a structure in which the bumps 34 are welded to the actuators 22. Depending on the embodiment, a laser weld 48 can be provided by the actuator plating 26, the bump plating 42, or both. The laser weld can be provided between bonding pads of the actuator 22 and bonding pads of the circuit layer 32. In FIG. 4, during the rightmost weld 48, the second dielectric layer 40 has been ablated and the trace 36 has been exposed. In an embodiment, a subsequently formed dielectric layer (not depicted for simplicity) can cover the exposed portion 50 of the trace 36. In another embodiment, this exposed portion 50 of trace 36 can be exploited to provide a contact to the trace 36 by a subsequently formed electrically conductive layer, for example when using a multilayer circuit printhead design.

After formation of the plurality of welds 48, processing can continue to form a completed print head. In an embodiment, this can include the formation of a plurality of ink ports through the diaphragm 20, standoff 30, and flex circuit 32 in accordance with some known designs, the attachment of an aperture plate to the inlet/outlet plate 14, and/or the attachment to various conductor and insulator layers to the upper surface of the circuit layer 32.

Figure 5:
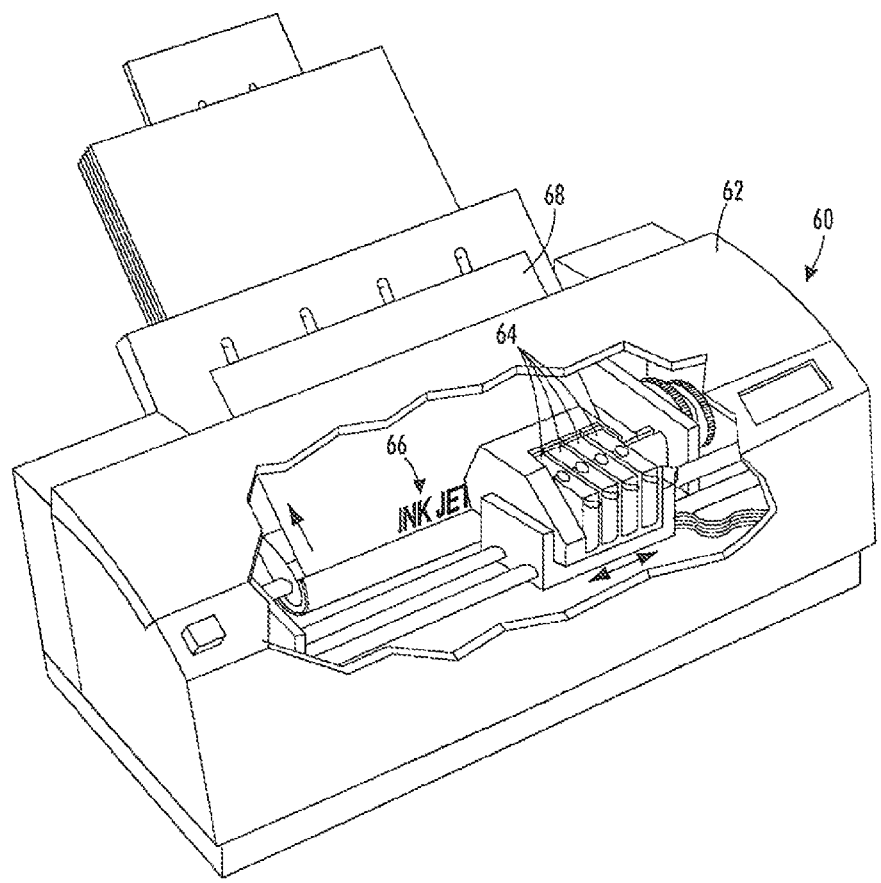
FIG. 5 is a perspective depiction of a printer which can include one or more print heads according to the present teachings.

FIG. 5 depicts a printer 60 including a printer housing 62 into which at least one print head 64 in accordance with the present teachings as discussed above has been installed. During operation of the printer 60, ink 66 is ejected from the one or more print heads 64. Each print head 64 is operated in accordance with digital instructions to create a desired ink image 66 on a print medium 68 such as a paper sheet, plastic, etc. Each print head 64 may move back and forth relative to the print medium 68 in a scanning motion to generate the printed image swath by swath. Alternately, each print head 64 may be held fixed and the print medium 68 moved relative to it, creating an image as wide as the print head 64 in a single pass. Each print head 64 can be narrower than, or as wide as, the print medium 68. In another embodiment, each print head 64 can print to an intermediate surface such as a rotating drum or belt (not depicted for simplicity) for subsequent transfer to a print medium.

A print head piezoelectric actuator is addressed many times during the lifetime of the print head. Conventional connection methods and structures used to connect a circuit layer to a piezoelectric actuator can show signs of fatigue, fretting, and wear, and the conductivity between the circuit layer and the actuator can be compromised. A laser weld in accordance with the present teachings can have increased resistance to fatigue, fretting, and wear compared to some conventional connection methods.

It will be apparent to one of ordinary skill in the art that the structures depicted and described herein represent generalized schematic illustrations and discussions, and that other components can be added or existing components can be removed or modified. For example, traces and/or bumps in accordance of the present teachings can include a copper layer having a nickel plating layer followed by a gold plating layer, wherein the nickel functions as a barrier layer to prevent gold migration into the copper, and the gold reduces oxidation of the nickel. The top of the piezoelectric actuator 22 can be nickel, and thus a laser weld can be provided using these structures.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming an ink jet print head, comprising:
    physically contacting a plating layer on a conductive bump of a conductive circuit layer of a circuit with a piezoelectric actuator of a print head subassembly;
    heating the conductive bump of the circuit layer and the piezoelectric actuator with a laser beam to melt the plating layer, wherein the plating layer is interposed between the conductive bump and the piezoelectric actuator; and
    cooling the melted plating layer to solidify the melted plating layer, wherein the solidified plating layer provides a laser weld which physically connects the conductive circuit layer to the print head subassembly and electrically couples the conductive circuit layer to the print head subassembly.

2. The method of claim 1, further comprising forming the plating layer on at least one of the conductive circuit layer bump and the piezoelectric actuator prior to heating the conductive circuit layer bump and the piezoelectric actuator.

3. The method of claim 2, wherein the conductive circuit layer comprises a conductive trace electrically coupled to the conductive bump and a dielectric layer covering the conductive trace, and the method further comprises ablating the dielectric layer to expose the conductive trace during the heating of the circuit layer bump and the piezoelectric actuator using the laser beam to melt the plating layer.

4. The method of claim 3, wherein the heating comprises the use of a green laser having a wavelength of about 532 nm.

5. The method of claim 4, wherein the heating forms the laser weld to comprise a diameter of between about 15 μm and about 30 μm.

6. The method of claim 3, wherein the heating comprises the use of a $CO_2$ laser having a wavelength of about 10 μm.

7. The method of claim 6, wherein the heating forms the laser weld to comprise a diameter of between about 75 μm and about 150 μm.

8. The method of claim 1 further comprising, during the heating of the conductive bump and the piezoelectric actuator, melting the plating layer at a temperature of between about 180° C. and about 190° C.

9. The method of claim 1 further comprising, during the heating of the conductive bump and the piezoelectric actuator, melting the plating layer at a temperature of between about 600° C. and about 1600° C.

* * * * *